(12) United States Patent
Matsuoka

(10) Patent No.: US 7,109,582 B2
(45) Date of Patent: Sep. 19, 2006

(54) SEMICONDUCTOR DEVICE FOR TESTING SEMICONDUCTORS

(75) Inventor: Tsugihiro Matsuoka, Oita (JP)

(73) Assignee: Sony Corporation, Tokyo (JP)

( * ) Notice: Subject to any disclaimer, the term of this patent is extended or adjusted under 35 U.S.C. 154(b) by 138 days.

(21) Appl. No.: 10/823,725

(22) Filed: Apr. 13, 2004

(65) Prior Publication Data

US 2004/0206984 A1   Oct. 21, 2004

(30) Foreign Application Priority Data

Apr. 18, 2003 (JP) ............................ P2003-113532

(51) Int. Cl.
*H01L 23/34* (2006.01)
*H01L 23/58* (2006.01)
(52) U.S. Cl. ........................................ 257/724; 257/48
(58) Field of Classification Search ................... 257/48, 257/723, 724
See application file for complete search history.

(56) References Cited

U.S. PATENT DOCUMENTS 6,734,549 B1 * 5/2004 Takeoka et al. ............ 257/700

* cited by examiner

*Primary Examiner*—Hung Vu
(74) *Attorney, Agent, or Firm*—Sonnenschein Nath & Rosenthal LLP

(57) ABSTRACT

A semiconductor device that enables a test for individual IC chips mounted on an interposer is provided. In the semiconductor device having the interposer on which a first IC chip and a second IC chip are mounted, the first IC chip and the second IC chip are connected to outside the interposer by input wring and output wiring, respectively, and a transistor element serving as a switch is inserted in series into the wiring connecting between the first IC chip and the second IC chip.

12 Claims, 2 Drawing Sheets

US 7,109,582 B2

SEMICONDUCTOR DEVICE FOR TESTING SEMICONDUCTORS

CROSS REFERENCE TO RELATED APPLICATION

The present document is based on Japanese Priority Document JP2003-113532, filed in the Japanese Patent Office on Apr. 18, 2003, the entire contents of which being incorporated herein by reference.

BACKGROUND OF THE INVENTION

1. Field of the Invention

The present invention relates to a semiconductor device, more specifically, to a semiconductor device in which a plurality of IC chips are disposed on a substrate and connected each other by wiring.

2. Description of the Related Art

In the related art, as part of an inspection for an interposer on which a plurality IC chips is mounted, a method for testing whether or not the interposer satisfies a required condition by measuring a current flow in the interposer is employed. (See, for example, Japanese Patent Application Publication No. Hei 7-49366, Page 2 to 3, FIG. 1). Specifically, an interposer 103 shown in FIG. 3 is tested in the following manner. The interposer 103 has an IC chip (1) 101 connected to outside the interposer 103 with a Pin11, Pin12, Pin13, . . . , Pin1n and an IC chip (2) 102 connected to outside the interposer 103 with a Pin21, Pin22, Pin23, . . . , Pin2m and to the IC chip (1) by internal wiring. The test of the interposer 103 is carried out by inputting signals into the Pin11, Pin12, Pin13, . . . , Pin1n and measuring signals outputted from the Pin21, Pin22, Pin23, . . . , Pin2m.

SUMMARY OF THE INVENTION

In the related art, a main purpose of providing such an interposer is to connect wiring between IC chips disposed therein. Accordingly, the interposer does not contribute in judging of whether the IC chips disposed therein have satisfied the required condition or not. In addition, a test circuit such as a BIST (built-in self test), which has been used for long time to test an integrated circuit or the like, is normally stored in an IC chip side, but not in an interposer side. In other words, in the interposer test of the related art, although the entire interposer may be tested, it is difficult to judge whether individual IC chips mounted on the interposer satisfy a required condition.

It is desirable to provide a semiconductor device that enables testing of individual IC chips mounted on a substrate. The present invention is made in view of the above.

According to an embodiment of the present invention, there is provided a semiconductor device. The semiconductor device includes a plurality of IC chips disposed on a substrate and connected to each other by wiring, in which each IC chip is connected to outside the substrate by input wiring and output wiring, and a transistor element serving as an operation checking switch for each IC chip is inserted in series into the wiring connecting between the IC chips.

In the semiconductor device, since each IC chip is connected to outside the substrate by the input wiring and output wiring, signals may be inputted from outside the substrate to the individual IC chips and the signals outputted from the individual IC chips may be taken out to outside the substrate. Further, since the transistor element serving as the operation checking switch for each IC chip is inserted in series into the wiring connecting between the IC chips, it is possible to switch between a normal operation mode and an operation checking mode for the IC chip.

As described above, according to the semiconductor device of the present invention, it is possible to carry out a test for individual IC chips mounted on a substrate.

DESCRIPTION OF THE PREFERRED EMBODIMENTS

Figure 1:
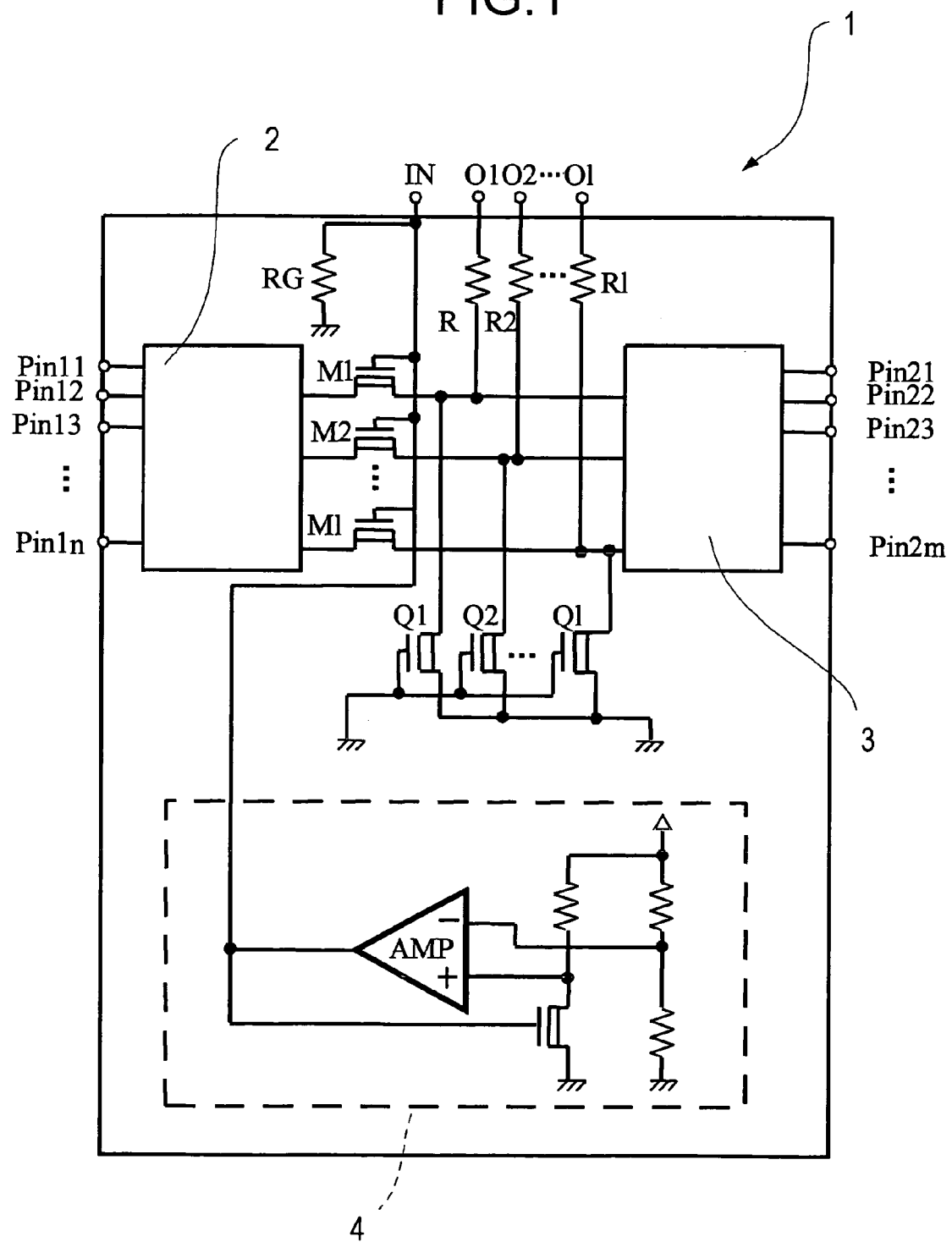
FIG. 1 is a circuit diagram explaining an example of semiconductor device to which the present invention is applied.

FIG. 1 is a circuit diagram explaining an example of semiconductor device to which the present invention is applied. An interposer 1 made of silicon shown in the figure has an IC chip (1) 2 and IC chip (2) 3 connected to the IC chip (1) 2 by internal wiring inside the interposer 1. A Pin11, Pin12, Pin13, . . . , Pin1n are formed as input terminals of the interposer 1 and a Pin21, Pin22, Pin23, . . . , Pin2m are formed as output terminals of the same.

MOS transistors of depletion mode FET (M1, M2, . . . , M1) are inserted in series into each wiring connecting the IC chip (1) to the IC chip (2) inside the interposer. Gate electrodes of each MOS transistor are coupled and connected to an external terminal IN and to an on-state resistance automatic compensation circuit 4. The MOS transistor serves as a switching element by controlling a voltage level of the external terminal IN. Further, the MOS transistor also plays a role as a damping resistor during the normal operation by adjusting a resistance value of each MOS transistor at ON state. The external terminal IN is connected to ground through a resistor RG and configured to keep a ground level when there is no input from the external terminal IN.

Each wiring connecting the IC chip (1) and the IC chip (2) inside the interposer is also connected to external terminals (01, 02, . . . , 01) through resistors (R1, R2, . . . , R1). Further, termination resistances (Q 1, Q2, . . . , Q1) are formed between ground and each wiring that connects the IC chip (1) and the IC chip (2) inside the interposer.

Figure 2:
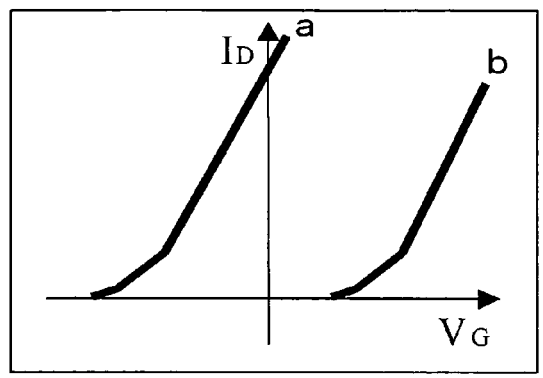
FIG. 2 is a schematic diagram showing a relationship between a gate potential VG and a drain current ID.
Figure 3:
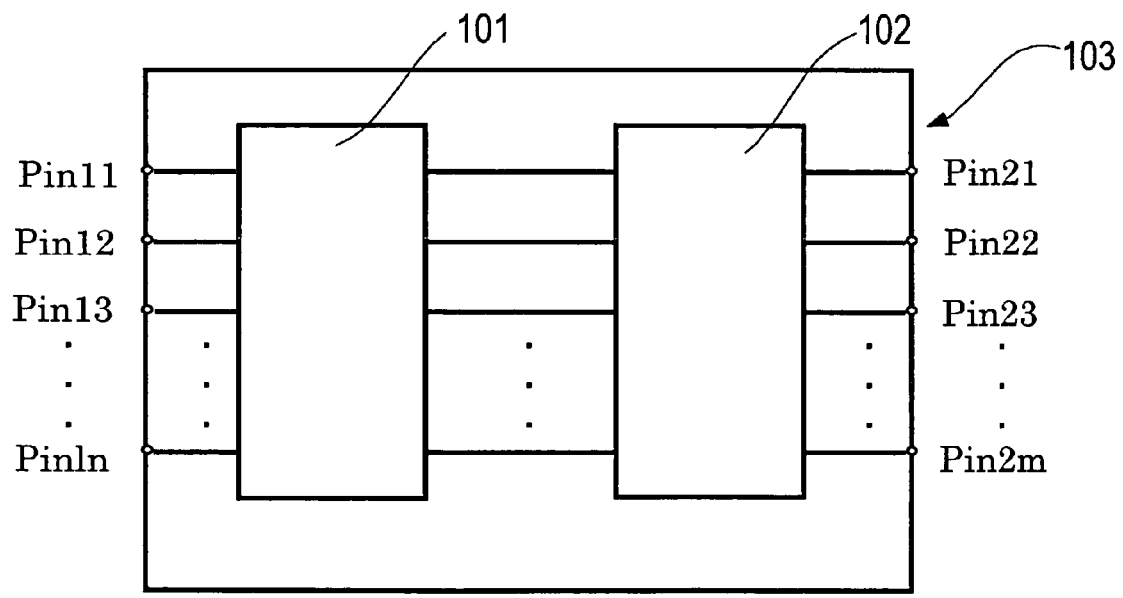
FIG. 3 is a circuit diagram explaining a semiconductor device in the related art.

The MOS transistor used for this case is sufficient if it serves as a switching element by controlling a voltage level of the external terminal IN at the time of operation checking for the IC chip, so that it is not necessarily always to be a MOS transistor of depletion mode FET. However, as apparent from a $V_G$-$I_D$ characteristic showing a relationship between a gate potential $V_G$ and a drain current $I_D$ in FIG. 2, a MOS transistor of depletion mode FET indicated as a symbol "a" in the figure maintains ON state when a gate voltage is $V_G$=0V while a MOS transistor of an enhance mode FET indicated as a symbol "b" in the figure becomes OFF state when a gate voltage is $V_G$=0V. Accordingly, from the viewpoint of reducing power consumption, the MOS transistor of depletion mode FET is preferable.

It is preferable to use the MOS transistor of depletion mode FET since it maintains ON state when a gate voltage is $V_G$=0V, an on-state resistance is low and a size of a transistor may be reduced. Mean while, since the MOS transistor of enhance mode FET requires to have both MOS and NMOS, a transistor size becomes larger and a transistor occupancy area becomes wider and also parasitic capacitance is increased. On the contrary, the MOS transistor of depletion mode FET basically accepts either one of PMOS or NMOS, so that it is also favorable when reduction of the cost for manufacturing the interposer is considered.

The MOS transistor used for this case is sufficient if it serves as a switching element when the operation checking for IC chip is carried out by controlling a voltage level of the external terminal IN. Accordingly, the MOS transistor is not necessarily always to play a role as a damping resistor during the normal operation. However, in order to improve signal quality between the IC chip (1) and the IC chip (2) during the normal operation, it is preferable if the MOS transistor serves as the damping resistor. From a viewpoint of carrying out the test for IC chip (1) and the IC chip (2) which are mounted on the interposer, the on-state resistance automatic compensation circuit is not always necessarily to be formed, however, since a resistance value of the MOS transistor at ON state is fluctuated depending on manufacture variation, power supply voltage fluctuations and temperature changes, it is preferable to form the on-state resistance automatic compensation circuit for suppressing these fluctuations as small as possible to keep the on-state resistance constant.

From a viewpoint of carrying out the test for IC chip (1) and the IC chip (2) which are mounted on the interposer, it is not necessarily always to form the termination resistance between ground and the wiring connecting the IC chip (1) and the IC chip (2) inside the interposer. However, similar to having the damping resistor described above, in order to improve the signal quality between the IC chip (1) and the IC chip (2) during the normal operation, it is preferable to form the termination resistance between ground and the wiring connecting the IC chip (1) and the IC chip (2) inside the interposer. Although it is not illustrated in the circuit diagram shown in FIG. 1, a similar technique as the on-state resistance automatic compensation circuit described above is also effective for the termination resistance.

In the described example of the semiconductor device to which the present invention is applied, although the explanation is made referring to the interposer having two IC chips, the number of IC chip to be mounted on the interposer is not limited to be two, but may be three or more.

In the described example of the semiconductor device to which the present invention is applied, although the explanation is made referring to the interposer made of silicon on which the MOS transistor is formed as the switching element, any kind of material may be used for the substrate as long as it is capable of forming the switching element. For example, a thin film transistor element may be formed as a switching element on a substrate made of glass.

In the above described example of the semiconductor device to which the present invention is applied, the test for the IC chips (1) is carried out in that a switch of the MOS transistor is made to be ON state, signals are inputted from the input terminals Pin11, Pin12, Pin13, . . . , Pin1$n$ of the interposer to the IC chip (1), and the signals outputted from the IC chip (1) are taken out from the external terminals (01, 02, . . . , 01); and the test for the IC chip (2) is carried out in that a switch of the MOS transistor is made to be OFF state, signals are inputted from the external terminals (01, 02, . . . , 01) to the IC chip (2), and the signals outputted from the IC chip (2) are taken out from the output terminals Pin21, Pin22, Pin23, . . . , Pin2$m$ of the interposer. Therefore, it is possible to check whether the required condition is satisfied, not only for the entire interposer but also for the IC chip (1) and IC chip (2) which are mounted on the interposer.

Further, because a damping resistor and a termination resistance are formed on the interposer as chip components, deterioration of the signal caused by radiation effect such as reflection due to a faster internal signal line of a recent interposer may also be controlled.

Finally, the embodiments and examples described above are only examples of the present invention. It should be noted that the present invention is not restricted only to such embodiments and examples, and various modifications, combinations and sub-combinations in accordance with its design or the like may be made without departing from the scope of the present invention.

What is claimed is:

1. A semiconductor device comprising:
   a plurality of IC chips that are connected each other by wiring and disposed on a substrate, each IC chip being connected to outside said substrate by input wiring and output wiring;
   at least one transistor element that is disposed in series with said connecting wiring between said IC chips and has a nominal resistance value, and said at least one transistor element serving as an operation checking switch for each correspondingly connected IC chip, and
   a compensation circuit that is electrically connected to said at least one transistor element and operable to automatically compensate for variations from said nominal resistance value.

2. The semiconductor device according to claim 1, wherein said at least one transistor element serves as a damping resistor.

3. The semiconductor device according to claim 1, further comprising a termination resistance that is disposed in parallel with said connecting wiring between said IC chips and grounded.

4. The semiconductor device according to claim 3, wherein said termination resistance and said compensation circuit are electrically connected.

5. The semiconductor device according to claim 1, wherein said at least one transistor element is a depletion mode FET.

6. The semiconductor device according to claim 1, wherein said substrate is a silicon substrate.

7. The semiconductor device according to claim 1, wherein said substrate is a glass substrate.

8. A semiconductor device comprising:
   a plurality of IC chips that are connected each other by wiring and disposed on a substrate, each IC chip being connected to outside said substrate by input wiring and output wiring,
   at least one transistor element that is disposed in series with said connecting wiring between said IC chips and has nominal resistance value, and said at least one transistor serving as an operation checking switch for each correspondingly connected IC chip,
   a compensation circuit that is electrically connected to said at least transistor element and operable to automatically compensate for variations from said nominal resistance value, and
   a termination resistance that is disposed in parallel with said connecting wiring between said IC chips and grounded, and said termination being electrically connected to said compensation circuit.

9. The semiconductor device according to claim 8, wherein said at least one transistor element serves as a damping resistor.

10. The semiconductor device according to claim 8, wherein said at least one transistor element is a depletion mode FET.

11. The semiconductor device according to claim 8, wherein said substrate is a silicon substrate.

12. The semiconductor device according to claim 8, wherein said substrate is a glass substrate.

* * * * *